(12) United States Patent
Yu et al.

(10) Patent No.: US 9,431,528 B2
(45) Date of Patent: Aug. 30, 2016

(54) LITHOGRAPHIC STACK EXCLUDING SIARC AND METHOD OF USING SAME

(71) Applicant: GLOBALFOUNDRIES Inc., Grand Cayman (KY)

(72) Inventors: Hong Yu, Rexford, NY (US); Xiang Hu, Clifton Park, NY (US); Zhao Lun, Ballston Lake, NY (US); Huang Liu, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 148 days.

(21) Appl. No.: 14/281,359

(22) Filed: May 19, 2014

(65) Prior Publication Data

US 2015/0332934 A1   Nov. 19, 2015

(51) Int. Cl.

| H01L 21/311 | (2006.01) |
|---|---|
| H01L 29/06 | (2006.01) |
| H01L 29/12 | (2006.01) |
| H01L 29/78 | (2006.01) |
| H01L 21/3105 | (2006.01) |
| H01L 29/66 | (2006.01) |
| H01L 21/02 | (2006.01) |

(52) U.S. Cl.
CPC ......... *H01L 29/78* (2013.01); *H01L 21/02532* (2013.01); *H01L 21/311* (2013.01); *H01L 21/3105* (2013.01); *H01L 21/31051* (2013.01); *H01L 21/31144* (2013.01); *H01L 29/0684* (2013.01); *H01L 29/12* (2013.01); *H01L 29/66545* (2013.01); *H01L 29/66636* (2013.01); *H01L 29/66795* (2013.01); *H01L 29/785* (2013.01); *H01L 29/7851* (2013.01)

(58) Field of Classification Search
None
See application file for complete search history.

(56) References Cited

U.S. PATENT DOCUMENTS

| 8,623,458 B2* | 1/2014 | Cheng | B82Y 10/00 427/256 |
|---|---|---|---|
| 8,828,493 B2* | 9/2014 | Cheng | G03F 7/0392 427/258 |

* cited by examiner

*Primary Examiner* — Seahvosh Nikmanesh
(74) *Attorney, Agent, or Firm* — Wayne F. Reinke, Esq.; Heslin Rothenberg Farley & Mesiti P.C.

(57) ABSTRACT

A lithographic stack over a raised structure (e.g., fin) of a non-planar semiconductor structure, such as a FinFET, includes a bottom layer of spin-on amorphous carbon or spin-on organic planarizing material, a hard mask layer of a nitride and/or an oxide on the spin-on layer, a layer of a developable bottom anti-reflective coating (dBARC) on the hard mask layer, and a top layer of photoresist. The stack is etched to expose and recess the raised structure, and epitaxial structure(s) are grown on the recess.

8 Claims, 5 Drawing Sheets

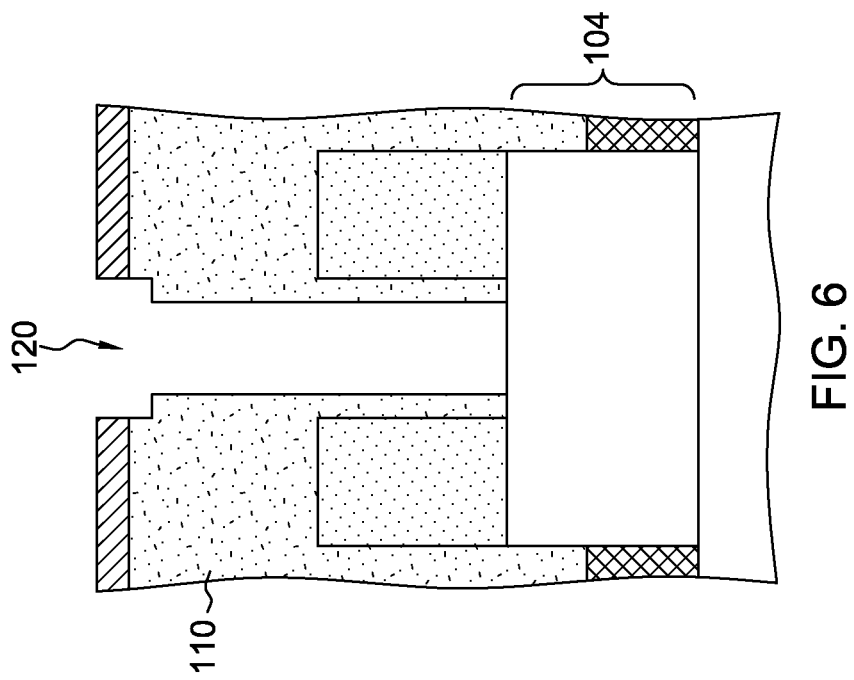
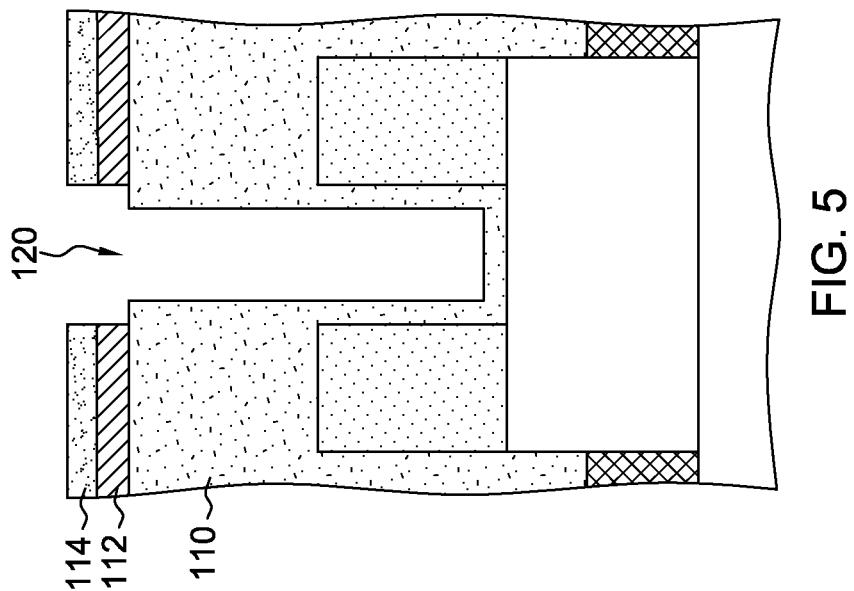

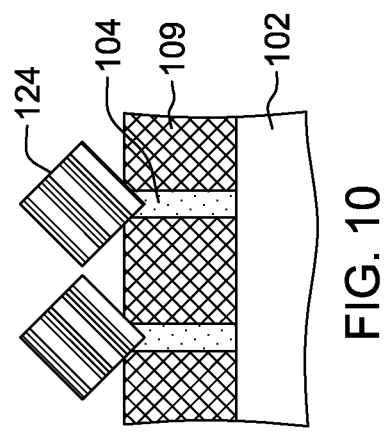
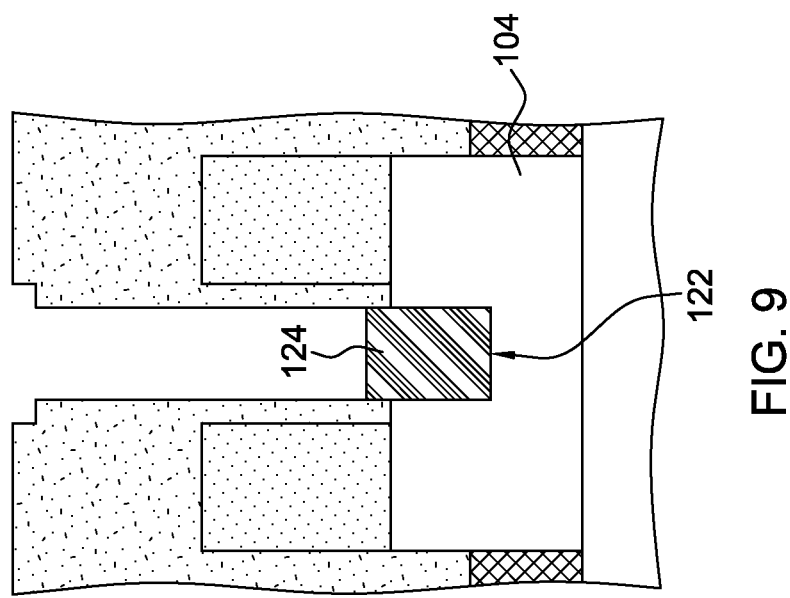

LITHOGRAPHIC STACK EXCLUDING SIARC AND METHOD OF USING SAME

BACKGROUND OF THE INVENTION

1. Technical Field

The present invention generally relates to lithography, and, in particular, to the use of a lithographic stack including a spin-on material, hard mask and a photosensitive developable bottom anti-reflective coating (dBARC) instead of a silicon-containing anti-reflective coating (SiARC).

2. Background Information

In lithography for non-planar semiconductor structures, a typical lithographic stack includes an organic planarizing layer (OPL), a silicon-containing anti-reflective coating (SiARC) and photoresist. Unfortunately, the various layers are not always a constant thickness in all areas of a wafer, which leads to potential defects in the features created. Further, the use of SiARC comes at the cost of a complex strip process, as a standard etch typically will not remove all of the SiARC material.

Thus, a need exists for improvements to lithographic stacks used with non-planar semiconductor structures.

SUMMARY OF THE INVENTION

The shortcomings of the prior art are overcome and additional advantages are provided through the provision, in one aspect, of a method of fabricating a semiconductor structure. The method includes providing a non-planar semiconductor structure, the structure including a semiconductor substrate, at least one raised semiconductor structure coupled to the substrate, and at least one dummy gate structure encompassing an exposed portion of the at least one raised structure. The structure further includes a lithographic stack conformally covering the non-planar structure, the lithographic stack including a layer of spin-on material, a hard mask layer above the spin-on layer, a layer of developable bottom anti-reflective coating (dBARC) above the hard mask layer, and a layer of lithographic blocking material above the dBARC layer. The method further includes etching the lithographic stack to expose at least one region of one or more of the at least one raised structure.

In accordance with another aspect, a non-planar semiconductor structure is provided. The non-planar semiconductor structure includes a semiconductor substrate, at least one raised semiconductor structure coupled to the substrate, at least one dummy gate structure encompassing an exposed portion of the at least one raised structure, and a layer of a conformal protective material over the at least one dummy gate structure. The structure further includes a lithographic stack over the non-planar structure, the lithographic stack including a layer of spin-on material, a hard mask layer above the spin-on layer, a dBARC layer above the hard mask, and a layer of lithographic blocking material above the dBARC layer.

In accordance with yet another aspect, a structure is provided. The structure includes a non-planar semiconductor structure including a semiconductor substrate, at least one raised semiconductor structure coupled to the substrate, at least one dummy gate structure encompassing an exposed portion of the at least one raised structure, and a layer of a conformal protective material over the at least one dummy gate structure. The structure further includes a lithographic stack over the non-planar structure, the lithographic stack including a layer of spin-on material, a hard mask layer above the spin-on layer, a dBARC layer above the hard mask, and a layer of lithographic blocking material above the dBARC layer.

These, and other objects, features and advantages of this invention will become apparent from the following detailed description of the various aspects of the invention taken in conjunction with the accompanying drawings.

BRIEF DESCRIPTION OF THE DRAWINGS

FIG. 5 depicts the non-planar structure of FIG. 4 after extending the opening through the spin-on layer to a protective layer above the raised structure.

FIG. 6 depicts the non-planar structure of FIG. 5 after extending the opening through the protective layer to expose the raised structure.

FIG. 9 depicts the non-planar structure of FIG. 8 after growing epitaxial structures on the raised structure recess.

FIG. 10 is a cross-sectional view of the structure of FIG. 9 taken across a raised structure in the top-down view of FIG. 1.

DETAILED DESCRIPTION OF THE INVENTION

Figure 2:
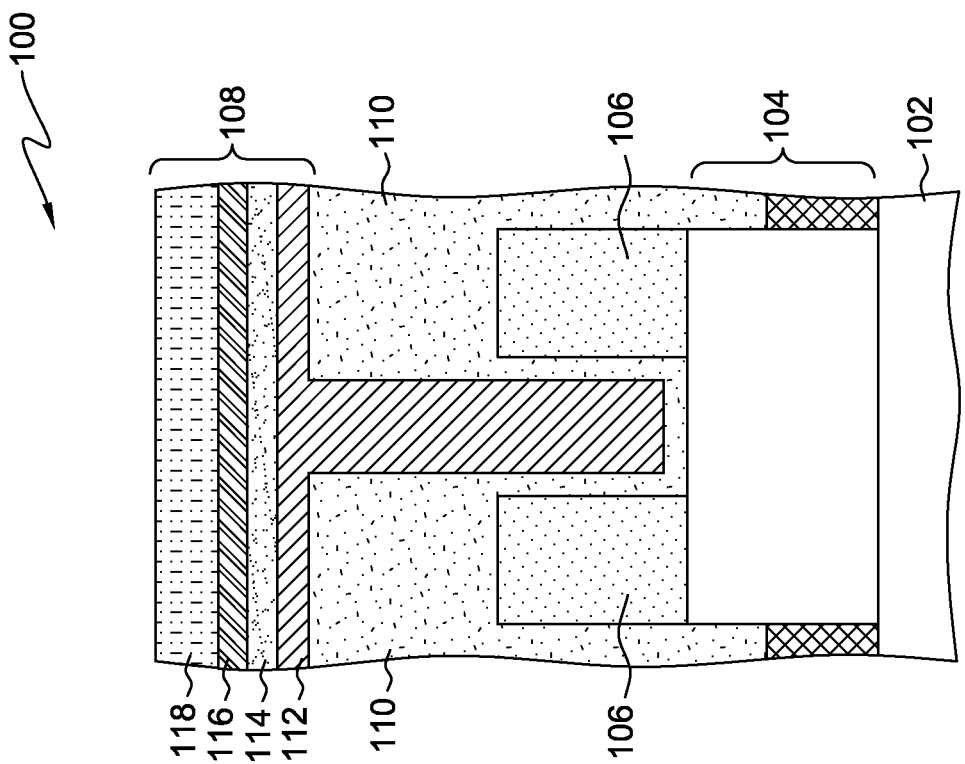
FIG. 2 is a cross-sectional view of the non-planar semiconductor structure of FIG. 1, taken through a raised semiconductor structure and including a lithographic stack over the non-planar structure in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

Figure 1:
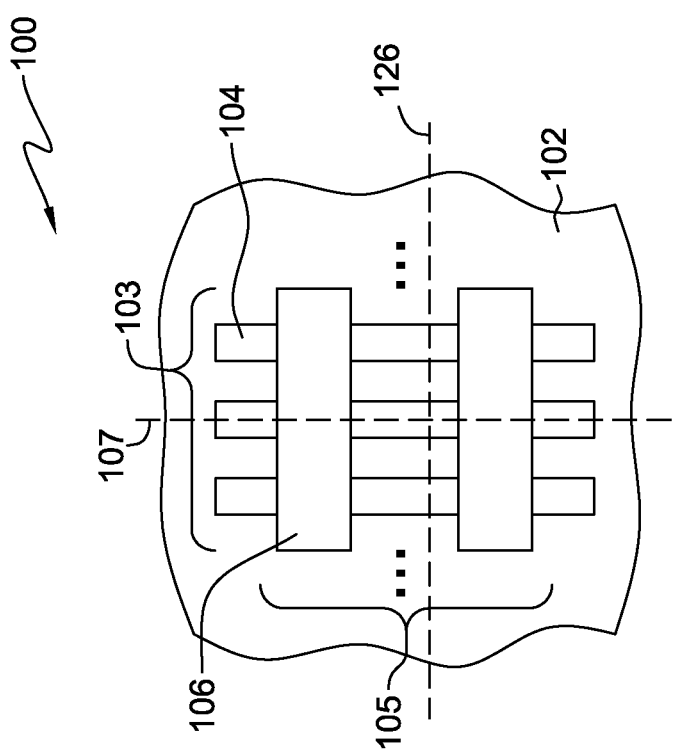
FIG. 1 is a top-down view of one simplified example of a non-planar semiconductor structure in accordance with one or more aspects of the present invention.
Figure 4:
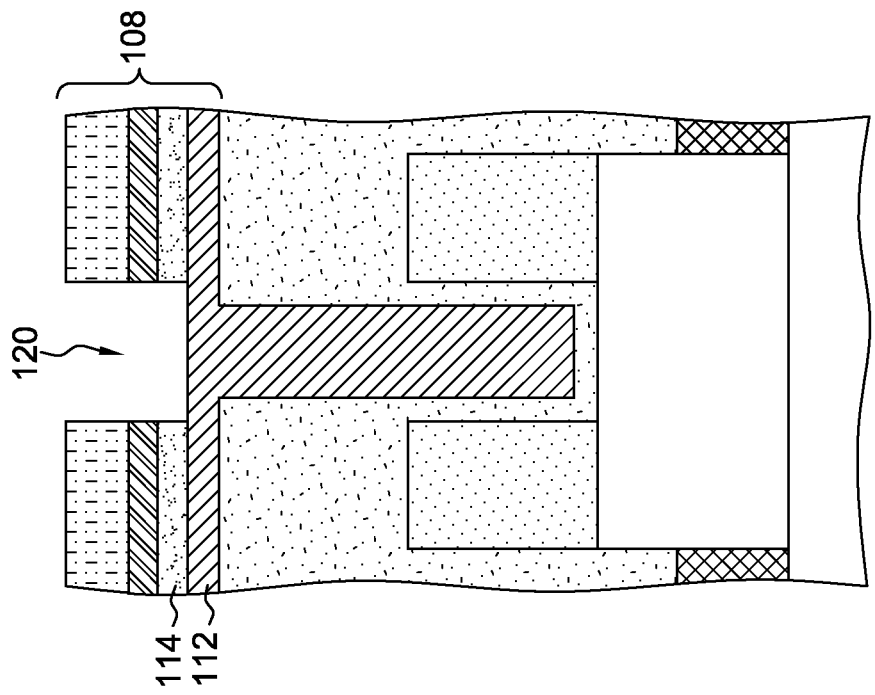
FIG. 4 depicts the non-planar structure of FIG. 3 after extending the opening through the hard mask layer to the spin-on layer.

FIG. 1 is a top-down view of one simplified example of a non-planar semiconductor structure 100 in accordance with one or more aspects of the present invention. The non-planar structure includes a semiconductor substrate 102, such as a bulk semiconductor material, for example, a bulk silicon wafer. As one skilled in the art will understand, where, as in the present example, a bulk semiconductor material is used, many transistors will be present, such that what is shown in FIG. 1 is repeated a large number of times across the wafer. In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The non-planar structure further includes raised semiconductor structures 103 (raised with respect to the substrate), for example, raised semiconductor structure 104. In one example, the raised structures may take the form of a "fin." The raised structures may include, for example, any of the materials listed above with respect to the substrate. Further, some or all of the raised structures may include added impurities (e.g., by doping), making them N type or P type. Portions of the raised structure(s), e.g., channel region(s) of a FinFET, are encompassed by dummy gate structures 105, for example, dummy gate structure 106. In one example, where the non-planar structure is silicon based, the dummy gate structure may include polycrystalline silicon. As one skilled in the art will know, a dummy gate (e.g., as part of a FinFET based process) holds the position for a conductive gate (e.g., metal) created later in the fabrication process.

Further details of the non-planar structure 100 of FIG. 1 are provided with reference to FIG. 2, which is a cross-sectional view of the structure taken across one of the raised structures at line 107 in FIG. 1. As noted above, the structure includes a semiconductor substrate 102 and one or more raised semiconductor structures 103 coupled to the substrate, one or more dummy gate structures 105 encompassing a portion of the raised structure, and a lithographic stack 108 conformally covering the non-planar structure. In addition, conformally covering the dummy gate structure underneath the lithographic stack is a layer 110 of protective material(s). Portions of the protective layer may be referred to herein by their common names, for example, a cap is directly above the dummy gate structure and spacers run along the sides of the dummy gate structure, as shown on FIG. 2.

The lithographic stack 108 includes a layer 112 of spin-on material, a hard mask layer 114 above the spin-on layer, a layer 116 of anti-reflective material above the hard mask and a layer 118 of lithographic blocking material above the layer of anti-reflective material. The purpose of the layer of spin-on material is to fill in the topography of the patterned surface, in order to achieve a planar surface for the next layer of the lithographic stack. In one example, the layer of spin-on material includes an amorphous carbon film. As one skilled in the art will know, a spin-on deposition typically involves dispensing a material in liquid form onto a substrate (e.g., bulk substrate or wafer) in a predetermined amount. The substrate is then rapidly rotated (e.g., up to about 6000 rpm) to uniformly distribute the material. The uniformly distributed material is then cured at a relatively low temperature. For example, a cure temperature for an amorphous carbon film may be about 200 degrees Celsius to about 450 degrees Celsius. In another example, the layer of spin-on material includes an organic planarizing layer (OPL). In both examples, the layer of spin-on material may have a thickness of about 100 nm to about 300 nm. The hard mask may include an oxide and/or a nitride, for example, silicon nitride ($Si_3N_4$), silicon oxynitride (SiON) and/or silicon dioxide ($SiO_2$). In one example, where the hard mask includes SiON or $SiO_2$, it can be conformally deposited using Chemical Vapor Deposition (CVD) or Atomic Layer Deposition (ALD). The layer of anti-reflective material may include, for example, a Photosensitive developable Bottom Anti-Reflective Coating (dBARC) having a thickness of, for example, about 10 nm to about 100 nm. Finally, the layer of lithographic blocking material may include, for example, photoresist, having a thickness of, for example, about 50 nm to about 300 nm. Both the layer of anti-reflective material and the layer of lithographic blocking material may be deposited using, for example, a coating method, e.g., spin-on coating.

Figure 3:
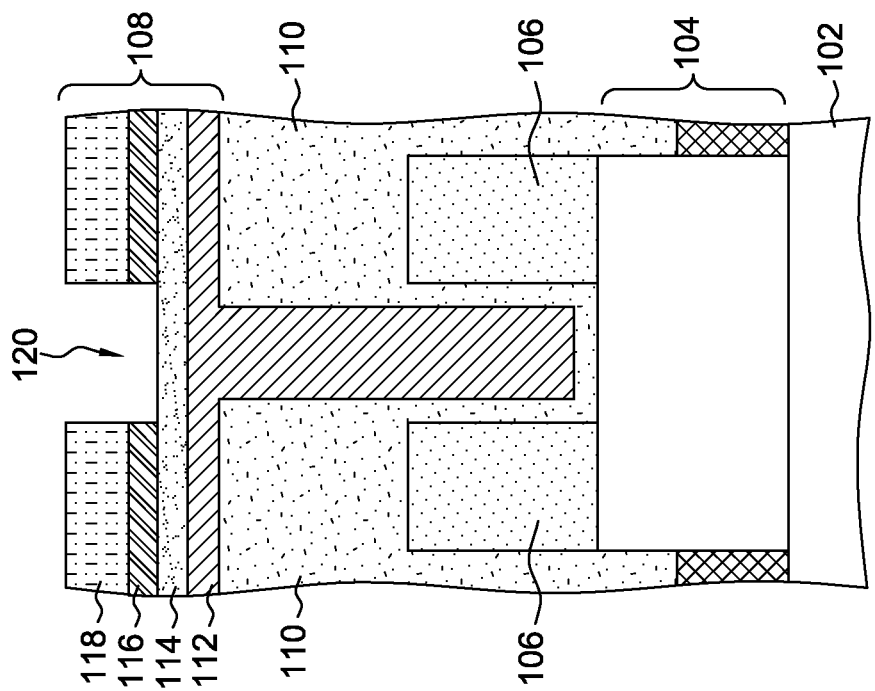
FIG. 3 depicts the non-planar structure of FIG. 2 after etching an opening in a portion of the lithographic stack above a region of the raised structure where an epitaxial structure will subsequently be grown.

As shown and described with respect to the example of FIGS. 3-6, the lithographic stack is etched to expose a region of one or more of the raised structures (see FIG. 6), for example, a source region and/or a drain region. As shown in FIG. 3, a first portion of the lithographic stack 108 may be removed, creating an opening 120 above the raised structure where epitaxial structure(s) will subsequently be grown. In the present example, the portion of the lithographic stack removed includes portions of the layers of lithographic blocking material 118 and anti-reflective layer 116. As one skilled in the art will understand, the lithographic blocking material and the anti-reflective layer are typically removed during the lithographic process with developer chemistry. Further, the hard mask layer 114 acts as a stop for the etch. As shown on FIG. 4, the opening 120 may be extended to expose the layer 112 of spin-on material by etching the hard mask layer 114. In one example, the hard mask layer may be etched to extend the opening using $C_xF_y$-based or $CH_2F_2$ (difluoromethane)/$CHF_3$ (trifluoromethane (R23))-based chemistry with a pressure of about 5 mT to about 100 mT and RF (radio frequency) power of about 100 W to about 10000 W. In one example, the $C_xF_y$ chemistry includes $CF_4$ (tetrafluoromethane). As shown in FIG. 5, the opening 120 may further be extended by etching the layer 112 of spin-on material, stopping on the layer 110 of protective material. Preferably, the etch for the spin-on layer also removes the layer 118 of lithographic blocking material and the layer 116 of anti-reflective material. In one example, the spin-on layer etch may be accomplished using a nitrogen gas ($N_2$) or hydrogen gas ($H_2$) based etch process with a pressure of about 20 mT to about 200 mT. As shown in FIG. 6, the layer 110 of protective material is etched to expose the raised structure 104. In one example, the layer of protective material includes a nitride, for example, silicon nitride ($Si_3N_4$), and may be etched using a process based on $CH_3F$ (fluoromethane)/$CH_2F_2$ (difluoromethane), $CH_2F_2$ (difluoromethane)/$CF_4$ (tetrafluoromethane), or $C_4F_8$ (octafluorocyclobutane)/$O_2$ (oxygen gas). Preferably, the etch for the protective layer also removes the remaining hard mask layer 114.

Figure 8:
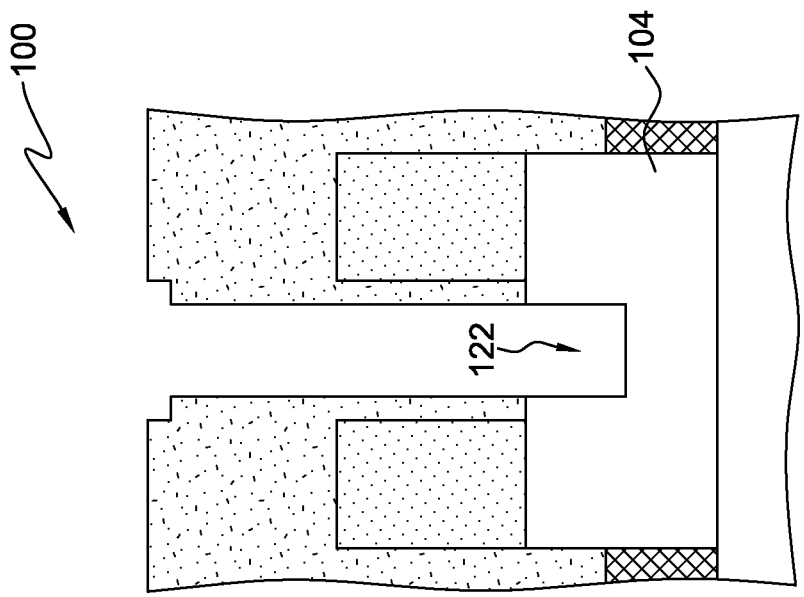
FIG. 8 depicts the non-planar structure of FIG. 7 after removal of the remaining spin-on layer.
Figure 7:
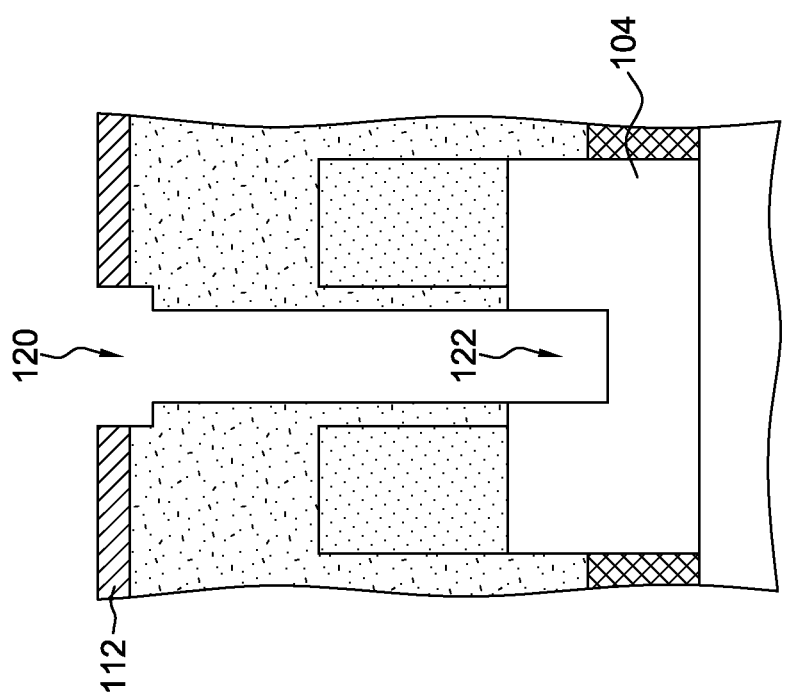
FIG. 7 depicts the non-planar structure of FIG. 6 after recessing the raised structure.

FIGS. 7-9 show one example of recessing the raised structure and growing epitaxial structure(s) on the recess. As shown in FIG. 7, the raised structure 104 is etched through opening 120 to create a recess 122. In one example, the recess can be created using an etch process based on, e.g., HBr (hydrogen bromide)/$O_2$ (oxygen gas), HBr/$Cl_2$ (chlorine gas)/$O_2$, $CF_4$ (tetrafluoromethane)/HBr/$O_2$, $CH_2F_2$ (difluoromethane)/$NF_3$ (nitrogen trifluoride). As shown in FIG. 8, the spin-on layer 112 is removed using, for example, an ashing or stripping process. As one skilled in the art will know, such a process uses a plasma source and, for example, oxygen or fluorine, to form an ash that can be easily removed, for example, with a vacuum pump. As shown in FIG. 9, an epitaxial structure 124 may be grown on the recess 122 of the raised structure 104. It will be understood that, typically, multiple epitaxial structures will be grown on a given raised structure. For example, where the regions of interest are sources and drains of transistors, epitaxial structures will typically be grown on both those regions of the raised structure. Further, the epitaxial material grown may be different, depending, for example, on the type of raised structure, e.g., N type or P type raised structures. Where the raised structure is N type, the epitaxial material may be, for example, silicon phosphorus (SiP) or silicon carbide (SiC).

Where the raised structure is P type, the epitaxial material may be, for example, silicon germanium. Shown in FIG. 10 is a simplified cross-sectional view of the non-planar structure of FIG. 9 taken across raised structure 104 at line 126 in FIG. 1. In the present example, the epitaxial material is silicon-based, which naturally grows into diamond shaped structures. Also shown is filler material 109 (e.g., field oxide) that serves a number of purposes, including an insulator and providing structural support for the raised structures.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A non-planar semiconductor structure, comprising:
   a semiconductor substrate;
   at least one raised semiconductor structure coupled to the substrate;
   at least one dummy gate structure encompassing an exposed portion of the at least one raised structure;
   a layer of a conformal protective material over the at least one dummy gate structure; and
   a lithographic stack over the non-planar structure, wherein the lithographic stack comprises a layer of spin-on material, a hard mask layer above the spin-on layer, a dBARC (developable bottom anti-reflective coating) layer above the hard mask and a layer of lithographic blocking material above the dBARC layer.

2. The non-planar semiconductor structure of claim 1, wherein the layer of spin-on material comprises an amorphous carbon film.

3. The non-planar semiconductor structure of claim 1, wherein the layer of spin-on material comprises an organic planarizing material.

4. The non-planar semiconductor structure of claim 1, wherein the hard mask comprises at least one of a nitride and an oxide.

5. The non-planar semiconductor structure of claim 4, wherein the at least one of a nitride and oxide comprises at least one of $Si_3N_4$, SiON and $SiO_2$.

6. The non-planar semiconductor structure of claim 1, wherein the conformal protective material comprises a nitride.

7. The non-planar semiconductor structure of claim 1, wherein the semiconductor substrate comprises a bulk semiconductor substrate, and wherein the at least one raised semiconductor structure comprises a plurality of raised semiconductor structures.

8. A structure, comprising:
   a non-planar semiconductor structure; and
   a semiconductor substrate;
   at least one raised semiconductor structure coupled to the substrate;
   at least one dummy gate structure encompassing an exposed portion of the at least one raised structure;
   a layer of a conformal protective material over the at least one dummy gate structure; and
   a lithographic stack over the non-planar structure, wherein the lithographic stack comprises a layer of spin-on material, a hard mask layer above the spin-on layer, a dBARC (developable bottom anti-reflective coating) layer above the hard mask and a layer of lithographic blocking material above the dBARC layer.

\* \* \* \* \*